United States Patent
Kahlon et al.

(10) Patent No.: US 8,647,446 B2
(45) Date of Patent: Feb. 11, 2014

(54) METHOD AND SYSTEM FOR IMPROVING PERFORMANCE AND PREVENTING CORROSION IN MULTI-MODULE CLEANING CHAMBER

(75) Inventors: Satbir Kahlon, Livermore, CA (US); Frank Ma, Scotts Valley, CA (US)

(73) Assignee: Intermolecular, Inc., San Jose, CA (US)

( * ) Notice: Subject to any disclaimer, the term of this patent is extended or adjusted under 35 U.S.C. 154(b) by 209 days.

(21) Appl. No.: 13/313,356

(22) Filed: Dec. 7, 2011

(65) Prior Publication Data
US 2013/0146103 A1  Jun. 13, 2013

(51) Int. Cl.
*B08B 5/00* (2006.01)

(52) U.S. Cl.
USPC ............. 134/31; 134/21; 134/25.1; 134/25.4; 134/25.5; 134/26; 134/30; 134/32; 134/33; 134/34; 134/36; 134/37; 134/42; 134/902; 216/58

(58) Field of Classification Search
USPC ........ 134/21, 25.1, 25.4, 25.5, 26, 30, 31, 32, 134/33, 34, 36, 37, 42, 902; 216/58
See application file for complete search history.

(56) References Cited

U.S. PATENT DOCUMENTS

| | | | |
|---|---|---|---|
| 5,580,421 A * | 12/1996 | Hiatt et al. | 438/708 |
| 5,912,184 A | 6/1999 | Young | |
| 7,544,574 B2 | 6/2009 | Chiang et al. | |
| 7,824,935 B2 | 11/2010 | Verma et al. | |
| 7,871,928 B2 | 1/2011 | Chiang et al. | |
| 7,902,063 B2 | 3/2011 | Chiang et al. | |
| 7,947,531 B1 | 5/2011 | Chiang et al. | |
| 8,011,317 B2 | 9/2011 | Weiner et al. | |
| 8,084,400 B2 | 12/2011 | Chiang | |
| 2007/0202610 A1 | 8/2007 | Chiang et al. | |
| 2007/0202614 A1 | 8/2007 | Chiang et al. | |
| 2007/0267631 A1 | 11/2007 | Weiner et al. | |
| 2008/0156769 A1 | 7/2008 | Weiner et al. | |
| 2011/0294303 A1 * | 12/2011 | Sankarakrishnan et al. | 438/758 |
| 2012/0260953 A1 | 10/2012 | Lim | |
| 2013/0133701 A1 | 5/2013 | Kahlon | |
| 2013/0134130 A1 * | 5/2013 | Kelekar | 216/83 |

OTHER PUBLICATIONS

USPTO; Office Action for U.S. Appl. No. 11/647,881 mailed on Jul. 21, 2010; 8 pages.
USPTO; Office Action for U.S. Appl. No. 11/647,881 mailed on Aug. 10, 2010; 11 pages.
USPTO; Final Office Action for U.S. Appl. No. 11/647,881 mailed on Apr. 29, 2011; 12 pages.
USPTO; Notice of Allowance for U.S. Appl. No. 11/647,881 mailed on Jun. 23, 2011; 9 pages.

* cited by examiner

*Primary Examiner* — Bibi Carrillo

(57) ABSTRACT

A method and system for cleaning a substrate in a multi-module cleaning assembly is provided. The method begins by receiving the substrate into the cleaning module. A cleaning chemistry, at a temperature elevated from an ambient temperature, is applied onto a top surface of the substrate. Concurrent with application of the cleaning chemistry, vapors are exhausted from the cleaning chemistry through a port located below a bottom surface of the substrate with the vapor exhaustion providing a negative pressure relative to a pressure external to the cleaning module. The application of the cleaning chemistry is terminated, followed by termination of the exhausting of the vapors. The substrate is dried after the flowing of inert gas is terminated.

8 Claims, 5 Drawing Sheets

METHOD AND SYSTEM FOR IMPROVING PERFORMANCE AND PREVENTING CORROSION IN MULTI-MODULE CLEANING CHAMBER

BACKGROUND

Cleaning operations are routinely performed during semiconductor processing. A module typically used to clean semiconductor substrates is a spin rinse dry (SRD) module. The semiconductor substrate is received by the SRD module for cleaning the wafer after a semiconductor processing operation is performed. Some cleaning processes performed in the SRD utilize heated chemistries for the cleaning operation. During the cleaning operation, the introduction of heated chemistries onto the substrate surface may result in vaporization of the heated chemistry within the SRD chamber. The vaporization of the heated chemistry can cause condensation upon the SRD walls and ceiling, which may be at ambient temperature. The vapor that condenses on the SRD walls and ceiling forms droplets which have the potential to be dislodged, especially from vibration of the SRD module during high speed rotation of the substrate during the drying process. These dislodged droplets may fall onto a substrate being cleaned. The vapor may also escape from the SRD module. The corrosive nature of the vapor can cause external tools and components of the external tools to fail or corrode and contaminate substrates being processed.

SUMMARY

The embodiments describe a method for improved cleaning of a substrate within a cleaning assembly. The embodiments prevent corrosive vapors of the cleaning assembly from contaminating external tools.

In some embodiments, a method is provided for cleaning a substrate in a multi-module cleaning chamber. The method begins by receiving the substrate into a cleaning module. An inert gas flows through an inlet disposed within a top surface of the cleaning module. A cleaning chemistry, at a temperature elevated from an ambient temperature, is applied onto a top surface of the substrate. Concurrent with application of the cleaning chemistry, vapors are exhausted from the cleaning chemistry through a port located below a bottom surface of the substrate with the vapor exhaustion providing a negative pressure relative to a pressure external to the cleaning module. The application of the cleaning chemistry is terminated, followed by termination of the exhausting of the vapors. The substrate is dried after the flowing of inert gas is terminated.

In some embodiments, a multi-module cleaning assembly is provided. The cleaning assembly has a bottom cleaning module for performing a spin-rinse-dry operation on a substrate, the bottom cleaning module having a base portion housing a chuck adapted for receiving the substrate. A top cleaning module is disposed over the bottom cleaning module, wherein a mid-portion of the cleaning assembly functions as a base of the top cleaning module and as a top of the bottom cleaning module. An inlet is disposed within a top surface of the cleaning assembly for flowing an inert gas into the cleaning module. A component is disposed in the cleaning assembly for applying a cleaning chemistry at a temperature elevated from an ambient temperature onto a top surface of the substrate. A port is located below a bottom surface of the substrate and operably connected to a vacuum source for exhausting vapors concurrently with application of the cleaning chemistry. The exhausting of vapors provides a negative pressure relative to a pressure external to the cleaning module.

BRIEF DESCRIPTION OF THE DRAWINGS

These and other advantages and aspects of the embodiments described will become apparent and more readily appreciated from the following detailed description of the embodiments taken in conjunction with the accompanying drawings, as follows.

DETAILED DESCRIPTION

Figure 1:
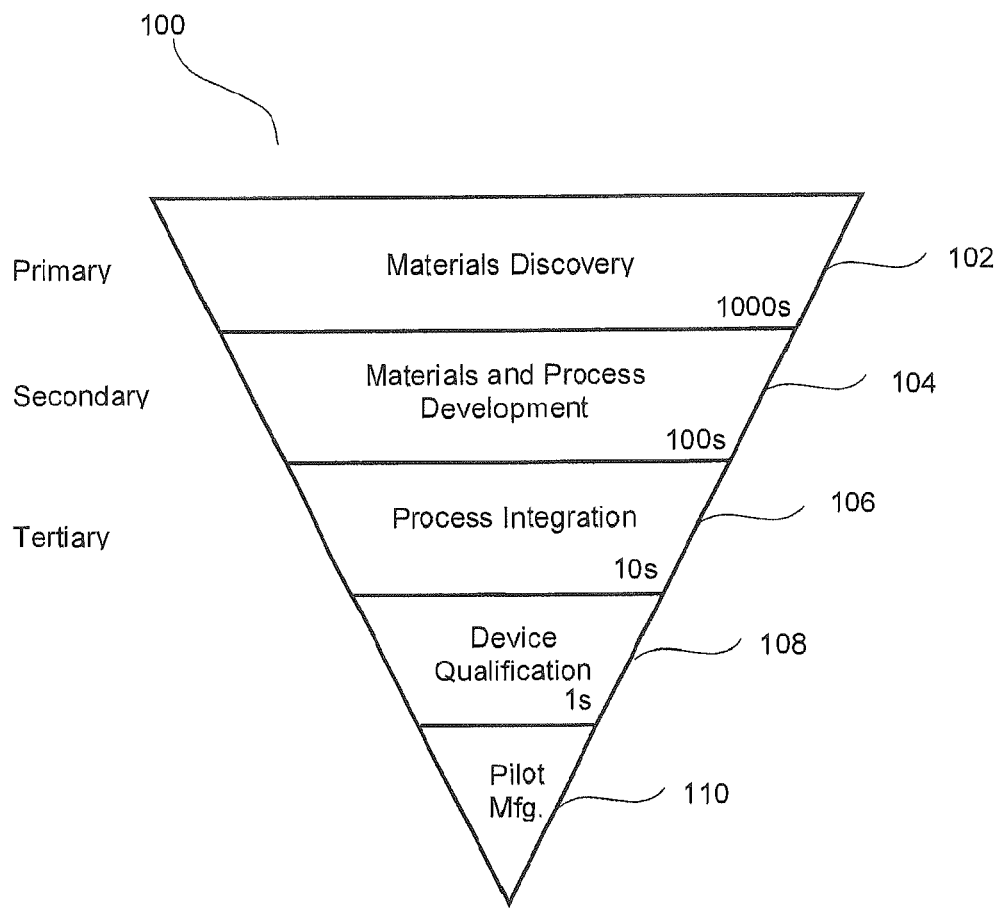
FIG. 1 illustrates a simplified schematic diagram providing an overview of the High-Productivity Combinatorial (HPC) screening process for use in evaluating materials, unit processes, and process sequences for the manufacturing of semiconductor devices in accordance with some embodiments.

The following description is provided as an enabling teaching of the invention and its best, currently known embodiments. Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. Accordingly, those who work in the art will recognize that many modifications and adaptations to the embodiments described are possible and may even be desirable in certain circumstances, and are a part of the invention. Thus, the following description is provided as illustrative of the principles of the embodiments of the invention and not in limitation thereof, since the scope of the invention is defined by the claims.

The embodiments describe a method for improved cleaning of a substrate within a cleaning assembly, such as a spin rinse and dry (SRD) module. The cleaning of the substrate utilizes cleaning chemistries at elevated temperatures (e.g., 85° C.). The elevated temperatures cause condensation to form on the walls and ceiling of the SRD module and may cause droplets to form which can fall onto the surface of the substrate and introduce contaminants. In addition, the vapor phase of some of the chemistries can escape from the SRD module, and because of the corrosive nature of the chemistries, these corrosive vapors can attack metal parts of the combinatorial processing chamber which can be proximate to the SRD module when the tools are clustered together. The embodiments establish a waste port within the SRD module that is in communication with a vacuum source configured to provide a low pressure/high conductance flow at the bottom of the SRD module. In some embodiments, the waste port is configured as an annular ring around a periphery of the bottom of the SRD module. The low pressure/high conductance flow provided by the waste port provides a laminar flow over the surface of the substrate being processed and maintains the SRD module at a negative pressure relative to an external environment. As the SRD module is not an airtight module, the laminar flow around the periphery of the substrate and the negative pressure is sufficient to entrain any fluid flow coming into the SRD module from the external environment. That is, any fluid flowing into the SRD module is prevented from contacting the substrate as the fluid flow from the external environment is drawn below the substrate upon entrance into the SRD module due to the flow characteristics of the low pressure/high conductance configuration.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to (i) test different materials, (ii) test different processing conditions within each unit process module, (iii) test different sequencing and integration of processing modules within an integrated processing tool, (iv) test different sequencing of processing tools in executing different process sequence integration flows, and combinations thereof in the manufacture of devices such as integrated circuits. In particular, there is a need to be able to test (i) more than one material, (ii) more than one processing condition, (iii) more than one sequence of processing conditions, (iv) more than one process sequence integration flow, and combinations thereof, collectively known as "combinatorial process sequence integration," on a single monolithic substrate without the need for consuming the equivalent number of monolithic substrates per materials, processing conditions, sequences of processing conditions, sequences of processes, and combinations thereof. This can greatly improve both the speed and reduce the costs associated with the discovery, implementation, optimization, and qualification of materials, processes, and process integration sequences required for manufacturing.

High Productivity Combinatorial (HPC) processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

Systems and methods for HPC processing are described in U.S. Pat. No. 7,544,574, filed on Feb. 10, 2006; U.S. Pat. No. 7,824,935, filed on Jul. 2, 2008; U.S. Pat. No. 7,871,928, filed on May 4, 2009; U.S. Pat. No. 7,902,063, filed on Feb. 10, 2006; and U.S. Pat. No. 7,947,531, filed on Aug. 28, 2009 each of which is incorporated by reference herein. Systems and methods for HPC processing are further described in U.S. patent application Ser. No. 11/352,077, filed on Feb. 10, 2006, now U.S. Pat. No. 8,084,400; U.S. patent application Ser. No. 11/419,174, filed on May 18, 2006, now abandoned; U.S. patent application Ser. No. 11/674,132, filed on Feb. 12, 2007; and U.S. patent application Ser. No. 11/674,137, filed on Feb. 12, 2007. The aforementioned patent applications claim priority from provisional patent application 60/725,186 filed Oct. 11, 2005. Each of the aforementioned patent applications and the provisional patent application are incorporated by reference herein.

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as electronic testers and imaging tools (e.g., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106 where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137, filed on Feb. 12, 2007, which is hereby incorporated by reference in its entirety. Portions of the '137 application have been reproduced below to enhance the understanding of the embodiments disclosed herein. The embodiments disclosed enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as material characteristics of components utilized within the unit manufacturing operations. Rather than only considering a series of local optimums, i.e., where the best conditions and materials for each manufacturing unit operation is considered in isolation, the embodiments described below consider effects of interactions introduced due to the multitude of processing operations that are performed and the order in which such multitude of processing operations are performed when fabricating a device. A global optimum sequence order is therefore derived, and as part of this derivation, the unit processes, unit process parameters, and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform throughout each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameters (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
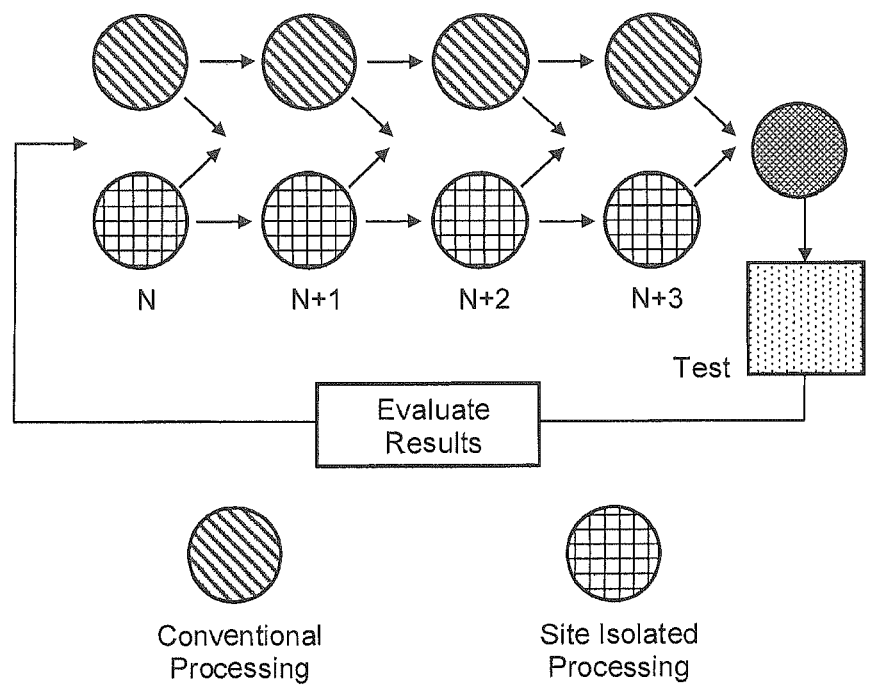
FIG. 2 illustrates a flowchart of a general methodology for combinatorial process sequence integration that includes site-isolated processing and/or conventional processing in accordance with some embodiments.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006 now U.S. Pat. No. 8,084,400. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g., from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments described herein perform the processing locally in a conventional manner, i.e., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
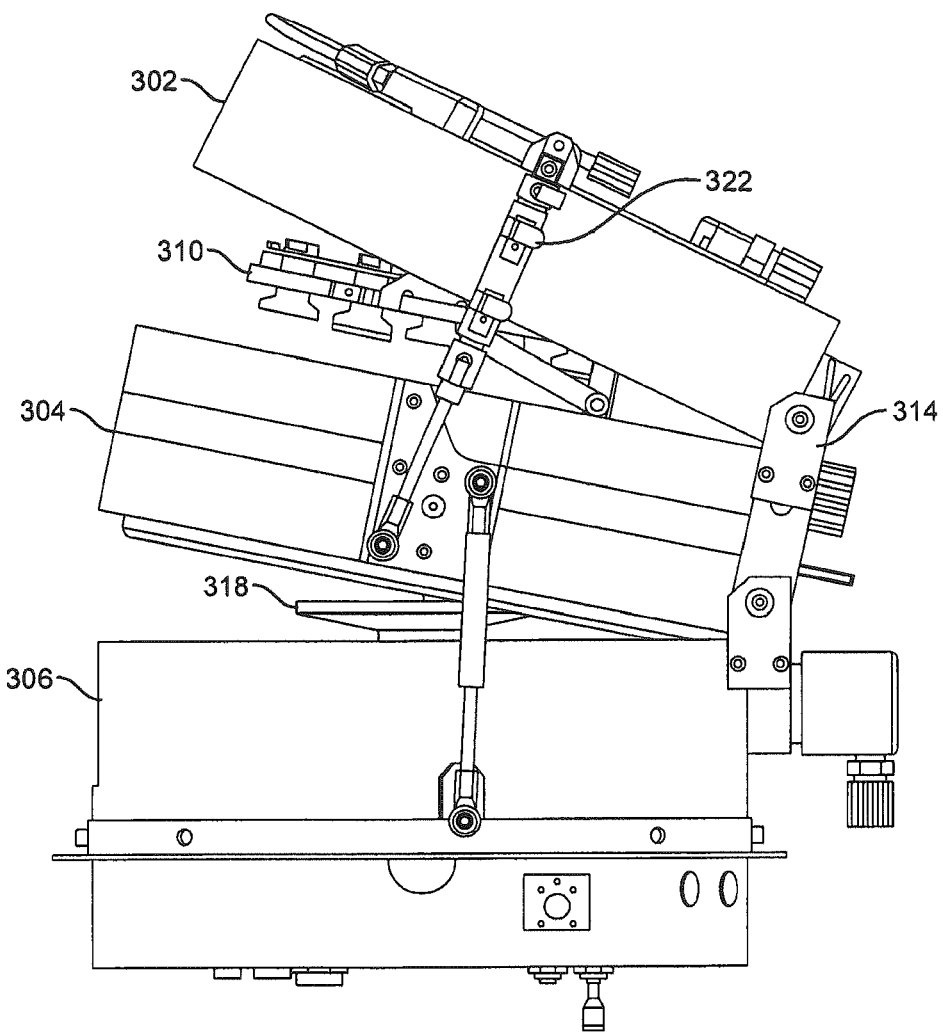
FIG. 3 illustrates a simplified schematic diagram of a perspective view of the cleaning chamber with top cleaning module and the bottom cleaning module in an open position in accordance with some embodiments.

FIG. 3 is a simplified schematic diagram illustrating a perspective view of a multi-module cleaning chamber with the top cleaning module and the bottom cleaning module in an open position in accordance with one embodiment of the invention. Lid 302 is in an open position through the support of hinge 314 and support cylinder 322. In the open position, the top cleaning module enables access for a substrate to be delivered so that support assembly 310 may couple to the substrate. In one embodiment, an end effector may be used to transport a substrate to and from the cleaning module, as well as between the top and bottom cleaning modules. Mid portion 304 is also illustrated as opened thereby enabling access to the bottom cleaning module 306. It should be appreciated that mid portion 304 functions as a base for the top cleaning module and a lid for the bottom cleaning module. Hinge 314 and support cylinder 322 provide the support and force necessary for opening or lifting mid portion 304. When in an open position, bottom cleaning module enables access for a substrate to be placed on chuck 318. It should be appreciated that one exemplary operation may include isolating the combinatorially processed regions of a substrate in the top cleaning module and cleaning the external areas of the substrate in the top cleaning module. After the cleaning operation in the top cleaning module the substrate is transported to the bottom cleaning module 306 for a spin, rinse, and dry (SRD) operation.

Figure 4:
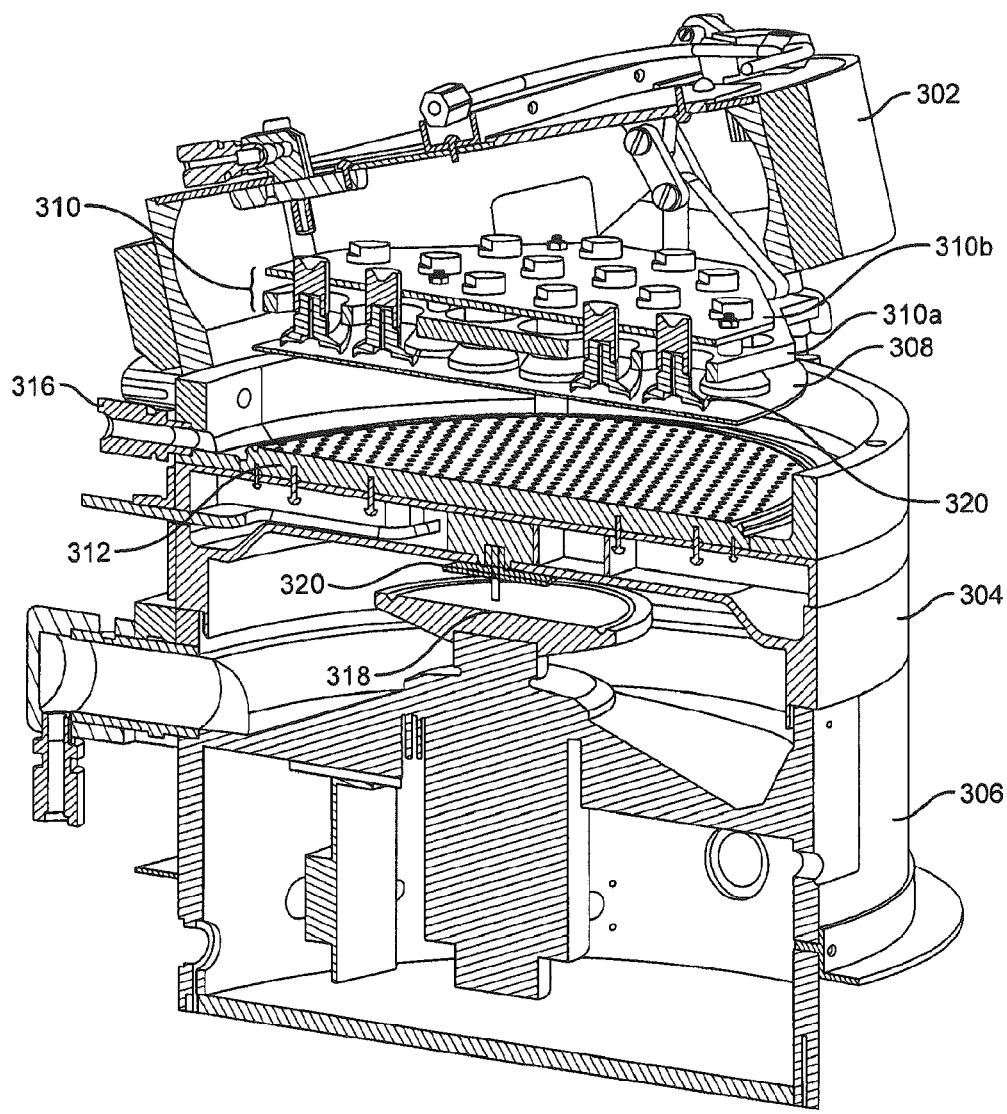
FIG. 4 illustrates a simplified schematic diagram of a perspective view of the bottom cleaning module in accordance with some embodiments.

FIG. 4 is a simplified schematic diagram illustrating a cross-sectional view of a multi-module cleaning chamber in accordance with one embodiment of the invention. Lid 302 houses or encompasses top and side surfaces of support assembly 310 when the lid is in a closed position. Support assembly 310 includes top plate 310b disposed over bottom plate 310a. Top plate 310b has a plurality of holes disposed thereon. Cups are disposed through the plurality of holes within top plate 310b and a plurality of holes in top plate 310a that are substantially aligned with corresponding holes of the bottom plate. Substrate 308 is supported through cups 320, as will be described in more detail below. When lid 302 is in a closed position, a bottom surface of substrate 308 will rest against chuck 312. Fitting 316 enables fluid flow to exit from the top cleaning module in one embodiment. As mentioned above, mid portion 304 functions as a bottom portion to the top cleaning module and a top portion of the bottom cleaning module. The bottom cleaning module, which includes base 306, functions as an SRD module in one embodiment. The SRD module includes chuck 318 that supports and rotates a substrate during a cleaning operation and a showerhead 320 disposed on a bottom surface of mid portion 304. The cleaning of the substrate in the SRD module utilizes cleaning chemistries at elevated temperatures, where the cleaning chemistries are delivered to a surface of a substrate being processed. It should be appreciated that the cleaning chemistries may be delivered through a nozzle or other suitable delivery mechanism. The elevated temperatures can cause condensation to form on the ambient temperature surface of the ceiling of the SRD module, which is a bottom surface of mid-portion 304. The condensation on the ceiling of the SRD may cause droplets to form which can fall onto the surface of the substrate and introduce contaminants. In some embodiments, an inert gas blanket or curtain is established just prior to, or concurrent with flowing the cleaning chemistry at the elevated temperature. The inert gas blanket can be introduced through showerhead 320, as well as alternative types of showerheads, where each of the showerheads directs the flow from an inlet along the ceiling of the SRD module. The inert gas may be nitrogen in one embodiment and provides an inert gas blanket or layer along the top surface of the SRD module that effectively prevents the formation of condensation on the top surface when the heated chemistries are introduced. It should be appreciated that alternative inert gases may be utilized in some embodiments. It should be further appreciated that the inert gases may be supplied through an inlet port of mid portion 304 that is in fluid communication with showerhead 320. In some embodiments, the inlet port is centrally located and extends through a top surface of the SRD module.

It should be appreciated that the material of construction for support assembly 310 and the cups, chuck 312, and chuck 318 may be any suitable material compatible with the cleaning fluids and operations, such as plastic, e.g., a fluoropolymer, in one embodiment. In one embodiment, the chucks, linkages, covers and plates described herein are composed of Ethylene chlorotrifluoroethylene (ECTFE), the tubing is composed of Perfluoroalkoxy (PFA) PTFE: the basins and lid are composed of polytetrafluoroethylene (PTFE), and the O-rings are composed of a Perfluorinated Elastomer (FFKM). Further details on the multi-module cleaning assembly may be found in U.S. application Ser. No. 13/086,327 entitled "In-Situ Cleaning Assembly," filed on Apr. 13, 2011, and in U.S. application Ser. No. 13/305,332 entitled "Method and Apparatus for Dispensing an Inert Gas" filed on Nov. 28, 2011, both of which are incorporated by reference in their entirety herein.

In some embodiments, wafers come to the multi-module SRD for cleaning after processing in the combinatorial processing chamber: (i) to remove the sleeves marks that are left behind upon contact with the wafer, (ii) to clean interstitial areas, or (iii) to clean the entire wafer to remove particles before re-inserting the wafers back into the production line. Some of the cleaning processes require introduction of heat. Corrosion of metal parts in the system containing the SRD module is noticeable even at room temperature. Corrosion may get worse with the dispensing of the heated chemistries due to vaporization at elevated temperature and the leakage of the vapors outside of the SRD module where contact is made with components of other tools proximate to the SRD module in a cluster configuration.

In some embodiments, during the cleaning cycle, when chemistries are dispensed, heated chemistries vaporize and fill the multi-module SRD chamber depending upon temperature. When vapors make contact with the walls and ceilings of the multi-module SRD chamber that are at room temperature, condensation occurs. Vapors that condense on walls and ceiling forms droplets and have the potential to fall onto the wafer to create particles. The primary cause of particles on the wafer is the formation of water droplets that fall from the ceiling of the multi-module SRD chamber. Some of the chemistries in the vapor phase escape out of the multi-module SRD chamber. On system parts that are at room temperature, vapors that escape from the multi-module SRD chamber condense upon contact. Parts that are made of PTFE are resistant to all chemicals, but parts that are made of metal are not. Most of the chemistries used for cleaning are corrosive and react when in contact with metals. The multi-module SRD chamber has many components susceptible to corrosion such as heaters, frames, supports, screws, shields, etc. In order to reduce condensation of chemistry vapors on the walls/ceiling of the multi-module SRD chamber and prevent the escape of the corrosive vapors from the multi-module SRD chamber, low pressure/high conductance exhaust can be used to draw the vapor out of chamber during the dispense cycle to prevent the corrosive vapors from contacting surfaces of tools within the system. In addition, the pressure in the chamber is maintained at a negative pressure as compared to the pressure external to the chamber.

Figure 5:
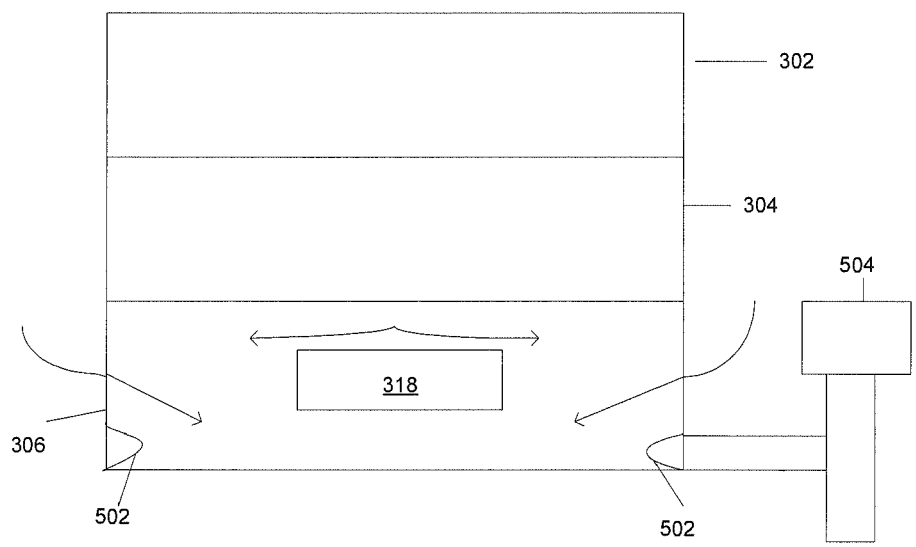
FIG. 5 illustrates a simplified schematic of an exhaust system to draw vapor out of the bottom cleaning module in accordance with some embodiments.

FIG. 5 illustrates a simplified schematic of an exhaust system to draw vapor out of the bottom cleaning module in accordance with an exemplary embodiment. The figure depicts the multi-module cleaning assembly including top portion 302, mid portion 304, and bottom portion 306. Also illustrated is chuck 318 on which the substrate is placed during SRD processing. The vacuum source 504 supplies the low pressure, high conductance fluid that draws the vapors from the bottom cleaning module 306 through an annular waste port 502 disposed along an outer peripheral region of the substrate thereby reducing condensation and consequently particles forming on the substrate. Corrosion is also prevented by not allowing vapors to escape the cleaning module 306. As illustrated, a negative pressure is maintained in module 306 relative to the external environment. The laminar flow over chuck 318 is created by the low pressure high conductance environment. It should be appreciated that any external air coming into module 306 is directed toward the bottom peripheral region to annular waste port 502 due to the conductance. In some embodiments, the pressure ranges from about −0.1 to −0.7 inches water column and the conductance is between about 1-60 cfm flow as measured at the outlet port of SRD. That is, the external air entering module 306 is entrained with the laminar flow leaving chuck 318 and removed through annular waste port 502. As such, the external air entering module 306 does not contact chuck 318. In some embodiments, the negative pressure achieved through the annular ring for waste port 502 is initiated when the cleaning chemistry is applied to the surface of the substrate. In other embodiments, the negative pressure is terminated when the application of the cleaning chemistry is terminated. For example, during a dry cycle in the SRD module, where chuck 318 rotates the substrate at a rate of about 2000 rotations per minute or greater, the exhaust may be terminated upon completion of the application of the cleaning chemistry in some embodiments.

The corresponding structures, materials, acts and equivalents of all means plus function elements in any claims below are intended to include any structure, material, or acts for performing the function in combination with other claim elements as specifically claimed.

Those skilled in the art will appreciate that many modifications to the exemplary embodiment are possible without departing from the spirit and scope of the present invention. In addition, it is possible to use some of the features of the present invention with the corresponding use of the other features. Accordingly, the foregoing description of the exemplary embodiment is provided for the purpose of illustrating the principles of the present invention, and not in limitation thereof, since the scope of the present invention is defined solely by the appended claims.

What is claimed:

1. A method for cleaning a substrate, comprising:
   providing a cleaning assembly comprising:
   a bottom cleaning module for performing a spin-rinse-dry operation on a substrate, the bottom cleaning module having a base portion housing a chuck for receiving the substrate;
   a top cleaning module disposed over the bottom cleaning module, wherein a mid-portion of the cleaning assembly is operable to be a base of the top cleaning module and a top of the bottom cleaning module;
   a component located in the bottom cleaning module for applying a cleaning chemistry onto a top surface of the substrate; and
   a port located in the bottom cleaning module below a bottom surface of the substrate and operably connected to a vacuum source for exhausting vapors from the cleaning chemistry;
   transferring the substrate to the bottom cleaning module;
   applying the cleaning chemistry onto a top surface of the substrate, wherein the cleaning chemistry is at a temperature higher than ambient temperature;
   concurrent with introducing the cleaning chemistry, exhausting vapors from the cleaning chemistry through the port located in the bottom cleaning module;
   terminating application of the cleaning chemistry;
   terminating the exhausting of the vapors upon terminating the application of the cleaning chemistry; and
   drying the substrate after terminating the application of the cleaning chemistry.

2. The method of claim 1, wherein the exhausting of vapors from the cleaning chemistry is through an annular ring disposed along a lower outer peripheral region of the bottom cleaning module.

3. The method of claim 1 wherein the exhausting of vapors from the cleaning chemistry maintains a laminar flow over the top surface of the substrate.

4. The method of claim 1, wherein the exhausting of vapors from the cleaning chemistry includes flowing air into the bottom cleaning module from an environment external to the bottom cleaning module, wherein the air flowing into the bottom cleaning module from the external environment avoids contacting the substrate.

5. The method of claim 1, wherein the cleaning chemistry has a temperature of at least 85° C.

6. The method of claim 1, further maintaining a negative pressure in the bottom cleaning module of between about −0.1 to −0.7 inches water column.

7. The method of claim 1 wherein drying the substrate includes rotating the substrate.

8. The method of claim 1 wherein the cleaning chemistry comprises de-ionized water.

* * * * *